United States Patent
Benesch et al.

(10) Patent No.: US 11,070,050 B2
(45) Date of Patent: Jul. 20, 2021

(54) METHOD AND CIRCUIT FOR COMPLYING WITH MAXIMUM VALUES FOR OUTPUT PARAMETERS OF A POWER SUPPLY UNIT

(71) Applicant: Siemens Aktiengesellschaft, Munich (DE)

(72) Inventors: Karl Benesch, Waidhofen/Ybbs (AT); Wolfgang Paul, Maria Enzersdorf (AT)

(73) Assignee: Siemens Aktiengesellschaft, Munich (DE)

( * ) Notice: Subject to any disclaimer, the term of this patent is extended or adjusted under 35 U.S.C. 154(b) by 279 days.

(21) Appl. No.: 16/116,167

(22) Filed: Aug. 29, 2018

(65) Prior Publication Data

US 2019/0067935 A1 Feb. 28, 2019

(30) Foreign Application Priority Data

Aug. 29, 2017 (EP) .................................. 17188368

(51) Int. Cl.
*H02H 7/12* (2006.01)
*G01R 19/165* (2006.01)
(Continued)

(52) U.S. Cl.
CPC ..... *H02H 7/1203* (2013.01); *G01R 19/16538* (2013.01); *H02H 1/0007* (2013.01);
(Continued)

(58) Field of Classification Search
CPC .................. H02H 7/1203; G01R 19/16538
See application file for complete search history.

(56) References Cited

U.S. PATENT DOCUMENTS 3,356,930 A    12/1967   Lupoli et al.
6,144,187 A * 11/2000   Bryson ............... H02J 7/00712
                                           320/137
(Continued)

FOREIGN PATENT DOCUMENTS

| CN | 1808816 | 7/2006 |
|---|---|---|
| GB | 2522646 | 8/2015 |
| WO | WO 2012/148774 | 11/2012 |

OTHER PUBLICATIONS

Siemens: "Contorl Circuits in acc. with UL508A—UL guideline, chapter 4.3", XP055449293, Gefunden im Internet: URL:http://www.industry.usa.siemens.com/automation/us/en/industrial-controls/controls-news-and-events/Documents/Training%20UL_NFPA%20control%20panel_part2_April%202014.pdf, [gefunden am Feb. 8, 2018], the whole document,; 2014.

(Continued)

*Primary Examiner* — Scott Bauer
(74) *Attorney, Agent, or Firm* — Cozen O'Connor

(57) ABSTRACT

A method and a circuit for complying with specified maximum values for output parameters a power supply unit includes at least a non-floating switch converter, an output voltage control unit, a current limiter and a switch element, wherein actual values of the current and voltage outputs of the power supply unit are measured continuously, where an evaluation unit calculates actual output power values of the power supply unit from the actual measured values of the output current and voltages, and subsequently compares at least the respective actually measured values of the output current and the respective actually calculated output power values with specified maximum values such that if at least one of the specified maximum values is exceeded by an actually measured value of the output current and/or by an (Continued)

actually calculated output power value, a current flow in the power supply unit is then interrupted by the evaluation unit.

20 Claims, 4 Drawing Sheets

(51) Int. Cl.
  *H02H 1/00* (2006.01)
  *H02M 3/335* (2006.01)
  *H02H 3/42* (2006.01)
  *H02M 7/155* (2006.01)
  *H02M 3/156* (2006.01)
  *H02H 3/087* (2006.01)
  *H02H 7/122* (2006.01)

(52) U.S. Cl.
  CPC .............. *H02H 3/087* (2013.01); *H02H 3/42* (2013.01); *H02H 7/1227* (2013.01); *H02M 3/156* (2013.01); *H02M 3/33507* (2013.01); *H02M 7/1555* (2013.01)

(56) References Cited

U.S. PATENT DOCUMENTS

| | | | |
|---|---|---|---|
| 7,202,634 B2* | 4/2007 | Bucur | H02J 7/0068 |
| | | | 320/137 |
| 2006/0187605 A1* | 8/2006 | Titschert | H02H 9/047 |
| | | | 361/115 |
| 2010/0007998 A1 | 1/2010 | Dishman | |
| 2014/0300998 A1 | 10/2014 | Yu | |

OTHER PUBLICATIONS

Siemens: "Industrial control panels for the North American market", Industrial Controls—Answers for industry, XP055449302, Gefunden im Internet: URL:http://www.siemens.fi/pool/products/industry/iadt_is/tuotteet/pienjannitekojeet/kytkenta_suojaus_ja_ohjaus/ul-opas-2010-englanti.pdf, [gefun den am Feb. 8, 2018], the whole document; 2010.

Office Action dated Nov. 23, 2020 issued in Chinese Patent Application No. 201810995066.7.

Office Action dated Apr. 26, 2021 issued in European Patent Application No. 17188368.9.

* cited by examiner

METHOD AND CIRCUIT FOR COMPLYING WITH MAXIMUM VALUES FOR OUTPUT PARAMETERS OF A POWER SUPPLY UNIT

BACKGROUND OF THE INVENTION

1. Field of the Invention

The present invention relates to a method for complying with specified maximum values for output parameters of at least one power supply unit, in particular for an output current and an output power, in particular if a so-called single fault occurs in the at least one power supply unit, where the at least one power supply unit comprises at least a non-floating switch converter, a switch element, an output voltage control unit and an internal current limiter, and further relates to an associated circuit for performing the method in accordance with the invention.

2. Description of the Related Art

In many electrical installations today, power supply units that provide a DC voltage as an output voltage for supply are frequently deployed. Such power supply units are often deployed in switchgear cabinets for electrical installations in order that, e.g., a predefined supply voltage is available to control electronics or other parts of the electrical installation. Such power supply units provide a specified output voltage (e.g., 24 V DC voltage as a rated output voltage and 28 V DC voltage as a maximum output voltage) as a predefined supply voltage.

Such a power supply unit is usually fed from a single-phase or three-phase energy supply network, i.e., a three-phase network. Therefore, an input module (e.g., a rectifier unit) is often provided for such a power supply unit, and converts the AC voltage from the energy supply network into a DC voltage as an input voltage for the power supply unit. The power supply unit then converts the usually unstable input voltage into a constant output voltage or into the predefined supply voltage for the electrical installation, where a constant state of the output voltage and/or of an output current is achieved by closed-loop control of the energy flow. To this end, such a power supply unit comprises at least a switch converter and a periodically operating electronic switch element. Here, it is possible to deploy either electrically isolating switch converters with a metallic isolation (e.g., transformers) or non-floating (i.e., non-isolating) switch converters without metallic isolation. In the case of simple power supply units built into switchgear cabinets, non-floating switch converters are used, e.g., in order to allow a more economical embodiment of the installation being supplied with electrically isolated safety extra-low voltage. An output voltage control unit is also provided to comply with the specified output voltage.

In the case of power supply units installed in switchgear cabinets, energy limiters or an output power limiter of the power supply unit (e.g., rated output power of less than 100 W) may be provided, and compliance with specifications from corresponding standards and/or certification guidelines may be required for safety reasons, for example. Such specifications are defined in the so-called UL508 Class 2, for example, where UL signifies Underwriters Laboratories Inc.®, one of the leading organizations worldwide for testing and certification in the field of product safety, or in the US standard NEC Class 2 (National Electrical Code Class 2). Minimum safety requirements for a device or system are also defined by the standards of the International Electrotechnical Commission (IEC).

In order to comply with the specifications from standards and guidelines, in particular those of UL508 Class 2, specified maximum values for respective output parameters, in particular for the output current (e.g. maximum 8 A) and an output power (e.g. maximum 100 W), must not be exceeded at the output of a power supply unit, e.g., in order that more economical lines can be connected thereto. Therefore, such a power supply unit also comprises an internal current limiter that is used to prevent the output current from rising above a specified maximum value or to adjust the output voltage as the output current increases such that the maximum permitted output power is not exceeded. These values are continuously measured and monitored in order to comply with the specifications (e.g., as per UL508 Class 2). It must, however, be ensured in this case that the specified maximum values for the output parameters (particularly the output current and the output power) are complied with, even in the event of a single fault in the power supply unit (e.g., a fault in the output voltage control unit, a fault in the current limiter, or faulty switching of the switch converter), via corresponding measures (e.g., shutting down the power supply unit if a value is exceeded).

In order to ensure compliance with the maximum values as specified in, e.g., UL508 Class 2, additional redundant circuit components (e.g., a redundant embodiment of the current limiter and the output voltage control unit) can be implemented in the output circuit of the power supply unit, for example. Circuit components, e.g., for specifying the maximum or limit values of the respective output parameters (e.g., output current, output power), for capturing output current and output voltage, and a shutdown device are also required in the power supply unit. These circuit components can likewise be redundantly formed to ensure that the specified maximum values for the output parameters are complied with in the event of a single fault (e.g., short-circuit or interruption in one of the measuring, evaluation or shutdown components) or to ensure a reliable shutdown if these maximum values are exceeded.

However, as a result of the additional and, in general redundantly, formed circuit components for complying with the specified maximum values for the output parameters, the circuit of the power supply unit becomes relatively complex and resource-intensive. For example, the additional circuit components also result in higher costs, greater susceptibility to faults and possibly also an increased space requirement for the power supply unit. Furthermore, for example, many faults (so-called "dormant" faults) are not easily detected by the additional circuit components, thereby possibly preventing a shutdown of the power supply unit when the specified maximum values for the output parameters are exceeded.

SUMMARY OF THE INVENTION

In view of the foregoing, it is therefore an object of the invention to provide a method and a circuit via which, in a simple and economical manner, faults are detected more effectively and more quickly in a power supply unit with a non-floating switch converter, and compliance with specified maximum or rated values of the output parameters for the power supply unit is reliably ensured.

This and other objects and advantages achieved in accordance with the invention by a method and a circuit, in which actual values of an output current and an output voltage of the at least one power supply unit are measured continuously. From the respective actually measured values of output current and output voltage, respective actual output power values for the at least one power supply unit are then calculated by an evaluation unit. The respective actually measured values of the output current and the respective actually calculated output power values are compared by the evaluation unit with the corresponding specified maximum values for output current and output power. If at least one of the specified maximum values is exceeded by an actually measured value of the output current and/or by an actually calculated output power value, then the evaluation unit interrupts a current flow of the at least one power supply unit, i.e., the at least one power supply unit is permanently shut down.

The main point of the present invention is that deployment of the evaluation unit, via which the actually measured values of output current and output voltage, and an output power value that is actually calculated therefrom, are monitored and evaluated with reference to the specified maximum values, makes it possible to realize a simple and economical power supply unit that complies with the safety requirements of, e.g., UL508 Class 2, particularly even in the event of individual faults in the power supply unit (e.g., short-circuit or interruption in a component of the power supply unit). In other words, output current and output power of the power supply unit are continuously checked by the evaluation unit for compliance with the maximum permitted values (e.g., maximum rated output power of 100 W, maximum output current of 8 A), and a current flow of the power supply unit can be permanently and reliably interrupted if the specified maximum values are exceeded. As a result, it becomes possible to also configure cabling in a significantly simpler and cheaper manner while complying with relevant regulations.

With the aid of the method in accordance with the invention and the deployment of the evaluation unit, it is moreover possible to detect faults (in particular "dormant" faults) in the circuit of the power supply unit more effectively and more quickly, because the essential measured values (e.g., output current, or output voltage) are continuously and actually captured and evaluated. With the aid of the evaluation unit, it is additionally possible to limit the output parameters, in particular output current and output power, in an application-specific and/or customer-specific manner. These application-specific and/or customer-specific limit values can very easily be set and checked by the evaluation unit, for example. When setting the application-specific and/or customer-specific limit values, it must also be ensured that these lie within the specified maximum values and/or satisfy the specifications of safety regulations/standards (e.g., UL508 Class 2).

Furthermore, it is advantageous to continuously measure actual values of an input current of the at least one power supply unit and actual values of an input voltage of the at least one power supply unit. From the respective actually measured values for input current and input voltage of the at least one power supply unit, respective actual input power values for the at least one power supply unit are calculated by the evaluation unit. The evaluation unit then determines a difference between respective actually calculated output power values and respective actually calculated input power values and compares these differences with a specified maximum permitted power difference. If the calculated difference between actually determined output power value and input power value exceeds said maximum permitted power difference, then the current flow of the at least one power supply unit is interrupted by the evaluation unit or the power supply unit is permanently shut down. By comparing an actually calculated output power value with an actually calculated input power value, it is easily possible to identify single faults in circuit components of the power supply unit or in measuring units, particularly if the actually measured values of output current and output voltage or the output power value calculated therefrom are corrupted as a result of the fault.

In an ideal case, the input power and the output power are identical within a permitted tolerance range when using a power supply unit with a non-floating switch converter. The specification of the maximum permitted power difference allows for this permitted tolerance range, which is influenced by, e.g., precision of capture, filtering, or power calculation. If the difference between the respective actually calculated input and output power values exceeds the maximum permitted power difference, then it can be presumed that a fault or a malfunction is present in the power supply unit, preventing compliance with the specified maximum values. With corresponding measures, such as the interruption of the current flow of the power supply unit by the evaluation unit, the compliance with the specified maximum values is ensured.

In a preferred embodiment of the method in accordance with the invention, the evaluation unit regularly sends a trigger signal to a monitoring unit. The monitoring unit monitors a continuous receipt of the trigger signal and sends a reset signal to the evaluation unit if the trigger signal is absent. As a result of the reset signal and the resetting of the evaluation unit, the current flow of the at least one power supply unit is also interrupted. As a result of deploying the monitoring unit, the function of the evaluation unit can be checked very easily. In the event of a malfunction of the evaluation unit, this can be cleared by resetting the evaluation unit using the reset signal, for example. Furthermore, this ensures that a malfunction of the evaluation unit itself does not result in the specified maximum values for the output parameters of the power supply unit being exceeded.

Furthermore, it is beneficial if any operation of the switch converter of the at least one power supply unit outside of a voltage-controlled range and a current-controlled range is detected by the evaluation unit based on the actually measured values of output current and output voltage, and the current flow of the at least one power supply unit is then interrupted by the evaluation unit. To this end, the evaluation unit can compare the actually measured values for output current and output voltage with desired control values for these parameters, for example. Based on deviations of the actually measured values from the desired control values, it is possible, e.g., to detect operation of the switch converter outside of the voltage-controlled range or the current-controlled range and therefore to presume a malfunction in the output voltage control unit and/or in the internal current limiter of the power supply unit. With the aid of the evaluation unit, the current flow of the power supply unit can be interrupted and therefore the compliance with the specified maximum values for the output parameters can be ensured.

A supply voltage of the evaluation unit is also ideally measured and compared with a specified permitted value range for the supply voltage by the evaluation unit. By checking the supply voltage, it is very easy to identify whether a correct reference voltage has been assumed as a starting point for, e.g., the measured values. If the measured supply voltage deviates from the specified permitted value range, then the current flow of the at least one power supply unit is interrupted by the evaluation unit because, as a result of a wrongly presumed or specified reference voltage, faults may be present in the measurement and evaluation of the actual values of input voltage, input current, output current and output voltage.

For the purpose of interrupting the current flow of the at least one power supply unit, the switch element of the at least one power supply unit can ideally be activated by the evaluation unit accordingly. To this end, a corresponding control signal can be transmitted from the evaluation unit to the switch element of the power supply unit, as a result of which the switch element is opened or remains open according to the actual switch state. The switch clock of the switch converter is then terminated. As a result of using the switch element of the power supply unit, it is not necessary to install an additional switch element (e.g., circuit breaker for safety shutdown, etc.).

Alternatively or additionally, an activatable switch element can be deployed for the purpose of interrupting the current flow, where the switch element is mounted on the input side of the at least one power supply unit. This additional activatable switch element can then be activated accordingly by the evaluation unit, e.g., via a control signal. In other words, the additional switch element is opened when the presence of a malfunction or a single fault in the power supply unit is presumed by the evaluation unit. As an alternative to an additional switch element, it is also possible to use a switch converter that is arranged either upstream or downstream of the at least one power supply unit.

It is also an object of the invention to provide a circuit for performing the method in accordance with the invention. This circuit has at least one power supply unit, which comprises at least a non-floating switch converter, a switch element, an output voltage control unit and an internal current limiter. The circuit in accordance with the invention also has measuring units, which are configured to continuously measure actual values of an output current and an output voltage of the at least one power supply unit. The circuit in accordance with the invention also has an evaluation unit, which is configured to calculate actual output power values from actually measured values of the output current and the output voltage of the at least one power supply unit, to compare the respective actually measured values of the output current and the respective actually calculated output power values with specified maximum values, and to interrupt a current flow of the at least one power supply unit if at least one specified maximum value is exceeded.

The main point of the circuit in accordance with the invention is primarily that, as a result of using the evaluation unit, aside from measuring units for the continuous measurement of the actual values of output current and output voltage, no further additional and/or redundant circuit components have to be implemented. The circuit in accordance with the invention allows the realization of a simple, economical and space-saving power supply unit, via which it is possible in a simple manner to comply with specified maximum values for the output parameters and therefore with safety requirements as per, e.g., UL508 Class 2, particularly even in the event of individual faults and malfunctions in the power supply unit (e.g., short-circuit or interruption in a component of the power supply unit). Circuit components of the power supply unit do not have to be embodied redundantly and/or additional circuit components are no longer necessary due to the deployment of the evaluation unit. As a result, the susceptibility to faults is also decreased as a result of the reduced number of circuit components in the power supply unit. With the deployment of the evaluation unit, it is moreover possible to detect faults (in particular "dormant" faults) in the circuit of the power supply unit more effectively and more quickly, because the essential measured values (e.g. output current, or output voltage) are continuously and actually captured and evaluated.

In the case of power supply units which, due to functional requirements already include a microcontroller, e.g., as a control unit, the existing microcontroller can advantageously be used to implement the evaluation unit. Furthermore, a plurality of power supply units can be monitored in parallel by an evaluation unit for compliance with specified maximum values for the respective output parameters and, if a malfunction is detected in one of the power supply units, then the current flow of the corresponding power supply unit can be interrupted by the evaluation unit. The circuit in accordance with the invention can therefore be configured in an even more space-saving and economical manner.

In an advantageous embodiment of the circuit in accordance with the invention, measuring units are also provided for measuring actual values of an input voltage and an input current of the at least one power supply unit. The evaluation unit is then configured so as to calculate actual input power values from the actually measured values of the input voltage and the input current, to determine a difference between respective actually calculated output power values and respective actually calculated input power values, to compare said difference with a maximum permitted power difference, and to interrupt the power flow if the maximum permitted power difference is exceeded. As a result of measuring input voltage and input current and determining an actual input power value, which is compared with the actually calculated output power value, it is possible in a simple manner to detect single faults and malfunctions such as short-circuit, or interruptions, in circuit components of the power supply unit and to prevent the specified maximum values for the output parameters from being exceeded.

Also advantageous is the provision of a monitoring unit for receiving a trigger signal from the evaluation unit and sending a reset signal if the trigger signal is absent. The evaluation unit can be reset by the reset signal, and the current flow of the at least one power supply unit is thereby interrupted. The monitoring unit ensures in a simple and efficient manner that malfunctions of the evaluation unit itself result in a non-compliance with the specified maximum values for the output parameters of the power supply.

For the purpose of interrupting the current flow of the at least one power supply unit, the switch element of the at least one power supply unit can ideally be activated by the evaluation unit accordingly. By virtue of using the switch element that is already in the power supply unit or used by the relevant switch converter for the switch clock, the inventive circuit remains simple. However, the use of the switch element of the power supply unit by the evaluation unit for the purpose of interrupting the current flow is limited to circuit topologies in which no conductive connection can be established between an input side and an output side of the power supply unit due to a fault in a part and/or a malfunction of the switch element.

It can therefore be beneficial if a switch converter according to the so-called SEPIC design or a non-floating flyback converter is provided as a non-floating switch converter. In these switch converter topologies, the current flow is reliably terminated by activating the relevant switch element accordingly. The switch converter according to the SEPIC design ideally has at least two serial series capacitors or coupling capacitors in this case. This has the advantage that even in the event of a short-circuit of one of the series capacitors or coupling capacitors, no current can flow from the input to the output and back.

Alternatively or in addition to using the internal switch element of the power supply unit for the purpose of interrupting the current flow, the circuit in accordance with the invention can have an additional switch element that is mounted on an input side of the at least one power supply unit. With this additional switch element, the current flow of the at least one power supply unit can be interrupted when the additional switch element is accordingly activated by the evaluation unit. As an alternative to an additional switch element, a switch converter can also be provided for the purpose of interrupting the current flow of the at least one power supply unit, where the switch converter is arranged upstream or downstream of the at least one power supply unit.

As an alternative to a SEPIC converter or a non-floating flyback converter, a buck switch or a boost switch can also be provided as a non-floating switch converter. When using these switch converters, it is however necessary to provide an additional switch element on the input side of the power supply unit or an upstream or downstream switch converter to interrupt the current flow of the power supply unit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained below in an exemplary manner with reference to the appended figures, in which.

DETAILED DESCRIPTION OF THE EXEMPLARY EMBODIMENTS

Figure 1:
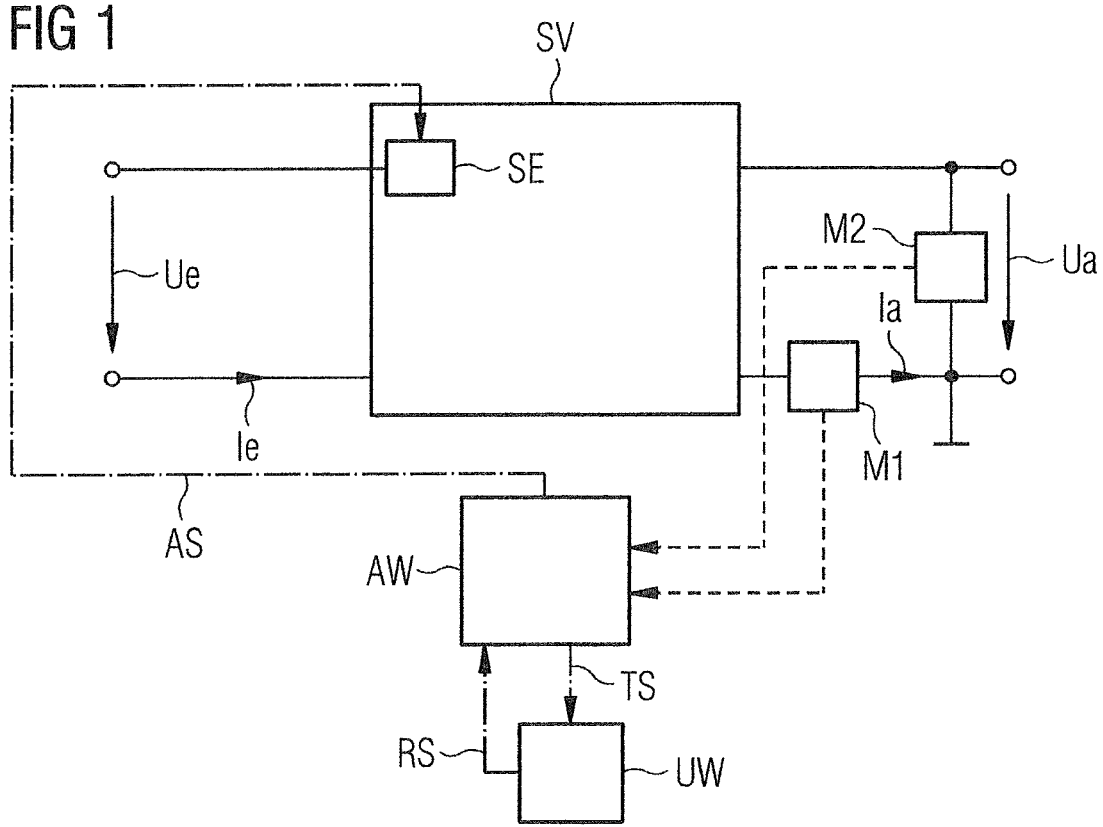
FIG. 1 schematically shows an exemplary embodiment of the circuit in accordance with the invention for performing the method for complying with specified maximum values for output parameters, with one power supply unit.

FIG. 1 schematically shows an exemplary embodiment of the circuit in accordance with the invention, via which it is possible to perform the inventive method for complying with specified maximum values for output parameters, primarily an output current Ia and/or an output power, of a power supply unit SV. The maximum values for the output parameters (i.e., for the output current Ia and the output power) of the power supply unit SV may be specified, for example, by safety specifications and/or guidelines as per e.g. UL508 Class 2 or NEC Class 2.

The circuit in accordance with the invention in this case includes the power supply unit SV, which comprises at least a non-floating switch converter, a switch element SE, an output voltage control unit and an internal current limiter. For greater clarity, a detailed illustration of the circuit components and structural units of the power supply unit SV is not included in FIG. 1 or in the following FIGS. 2 and 3.

The power supply unit SV is fed by an input voltage Ue and an input current Ie and delivers a specified output voltage Ua (e.g., 24 V DC voltage) to supply a load or a consumer unit. An output current Ia which must not exceed a specified maximum value (e.g., 8 A) flows on the output side. Furthermore, a maximum value (e.g., 100 W) that likewise must not be exceeded is specified for the output power of the power supply unit SV, which can be installed, such as within a switchgear cabinet.

In addition to the power supply unit SV, the circuit in accordance with the invention comprises measuring units M1, M2 for measuring the output current Ia and the output voltage Ua of the power supply unit SV. Here, an actual value of the output current Ia is continuously measured by a first measuring unit M1. The first measuring unit M1 can be formed as a shunt, for example. A shunt is usually a low-impedance electrical resistance via which, based on a voltage drop proportional to the current to be determined, the current flowing through the shunt is calculated. Alternatively, for example, a current converter or a device for measuring current via Hall sensors can also be used as a first measuring unit M1 for determining the output current Ia. An actual value of the output voltage Ua of the power supply unit SV is continuously calculated by a second measuring unit M2. For example, operation amplifiers, difference amplifiers or analog-digital converters can be deployed for the purpose of measuring the output voltage Ua.

The circuit in accordance with the invention further comprises an evaluation unit AW, which can be formed, for example, as a microcontroller or configured on a microcontroller that is already present as a result of functional requirements of the power supply unit SV. The values of the output current Ia that are actually measured by the first measuring unit M1 and the values of the output voltage Ua that are measured by the second measuring unit M2 are transferred to the evaluation unit AW. An actual output power value is calculated from the respective actual values of the output current Ia and the output voltage Ua by the evaluation unit AW. The respective actually measured value of the output current Ia is compared with the corresponding specified maximum value for the output current Ia (e.g., 8 A) by the evaluation unit AW. Furthermore, the respective actually calculated output power value is compared with the specified maximum value for the output power (e.g., 100 Watt) by the evaluation unit AW. If one or both of the two maximum values are exceeded, i.e., either a maximum specified output current or a maximum specified output power or both are exceeded, then a current flow of the power supply unit SV is interrupted by the evaluation unit AW because a fault in one of the circuit components of the power supply unit SV or a faulty function of the power supply unit SV is presumed.

In order to effect an interruption of the current flow of the power supply unit SV, the evaluation unit can activate the switch element SE of the power supply unit SV correspondingly, e.g., via a control signal AS, i.e., such that a switch clock of the switch converter of the power supply unit SV is stopped or the switch element SE is opened or remains open, depending on its current state. The switch element SE of the power supply unit can be used by the evaluation unit AW to interrupt the current flow if, e.g., a SEPIC converter or a non-floating flyback converter is deployed as a non-floating switch converter of the power supply unit SV. Use of such converter types ensures that, in the event of a fault in a part and/or a malfunction of the switch element SE, no conductive connection can be established between an input side and an output side of the power supply unit SV.

Figure 3:
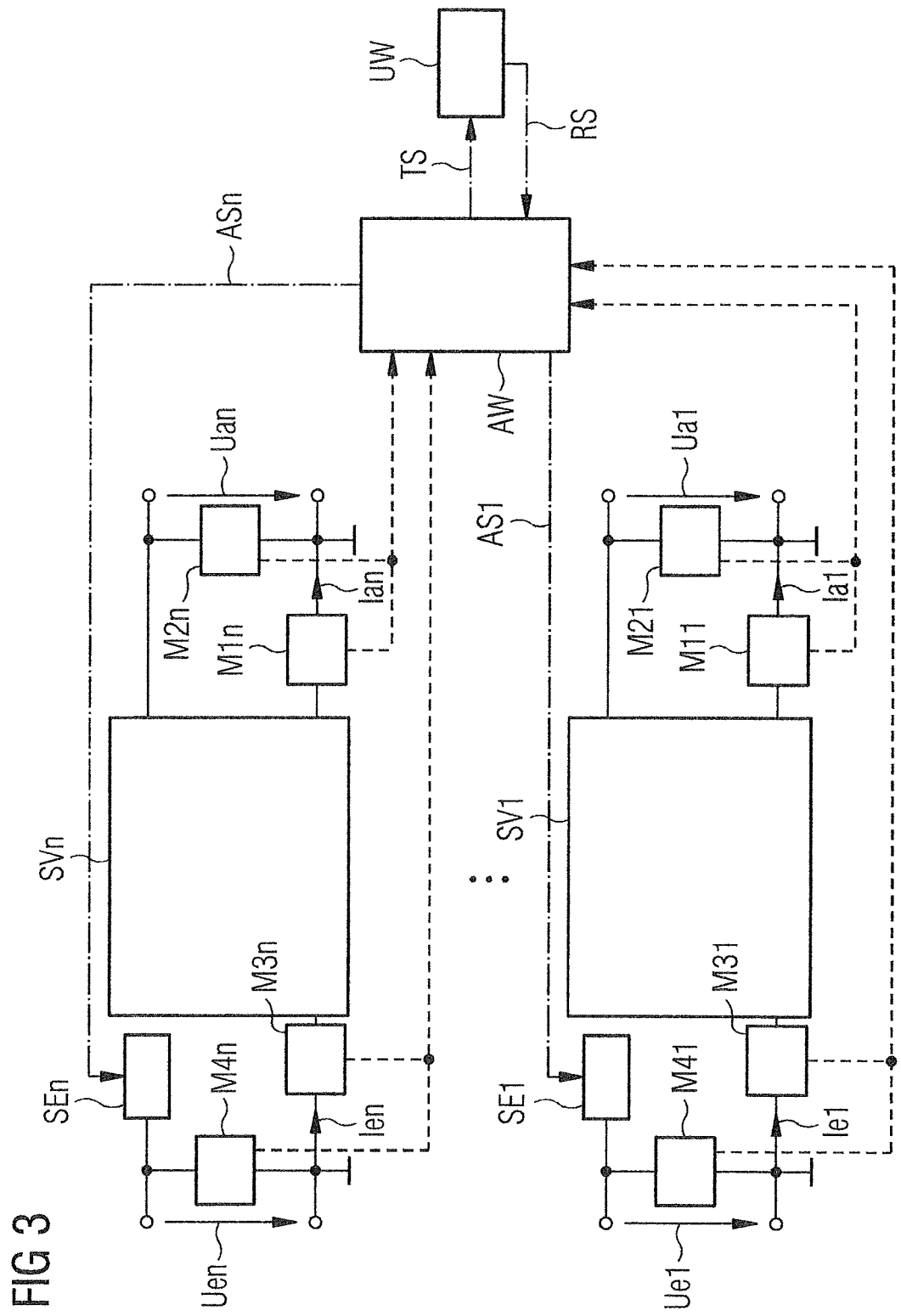
FIG. 3 schematically shows an exemplary embodiment of the circuit in accordance with the invention for performing the method for complying with specified maximum values for output parameters, with a plurality of power supply units.

As illustrated by way of example in FIG. 3, an additional switch element SE1, ..., SEn can alternatively or additionally be provided on an input side of the power supply unit SV, and so activated by a control signal AS from the evaluation unit AW so as to ensure an interruption of the current flow of the power supply unit SV if one of the maximum values is exceeded by an actually measured value of the output current Ia or one of the actually calculated output power values. Alternatively, a switch converter can also be arranged downstream or upstream of the power supply unit SV to interrupt the current flow. An additional switch element S1, ..., Sn or an upstream or downstream switch converter is used in the case of, e.g., embodiments of the inventive circuit in which, e.g., a buck switch or a boost switch is provided as a non-floating switch converter of the power supply unit SV.

The circuit in accordance with the invention also has a monitoring unit UW, via which fault-free functioning of the evaluation unit AW can be monitored and faulty functioning of the evaluation unit AW can be detected. To this end, a trigger signal TS is sent to the monitoring unit UM at regular time intervals by the evaluation unit AW. If no trigger signal TS from the evaluation unit AW is received by the monitoring unit UW, then a reset signal RS is sent from the monitoring unit to the evaluation unit AW. The evaluation unit AW can be reset by the reset signal to clear a possible malfunction, for example. As a result of resetting the evaluation unit AW, the current flow of the power supply unit SV is also interrupted.

Figure 2:
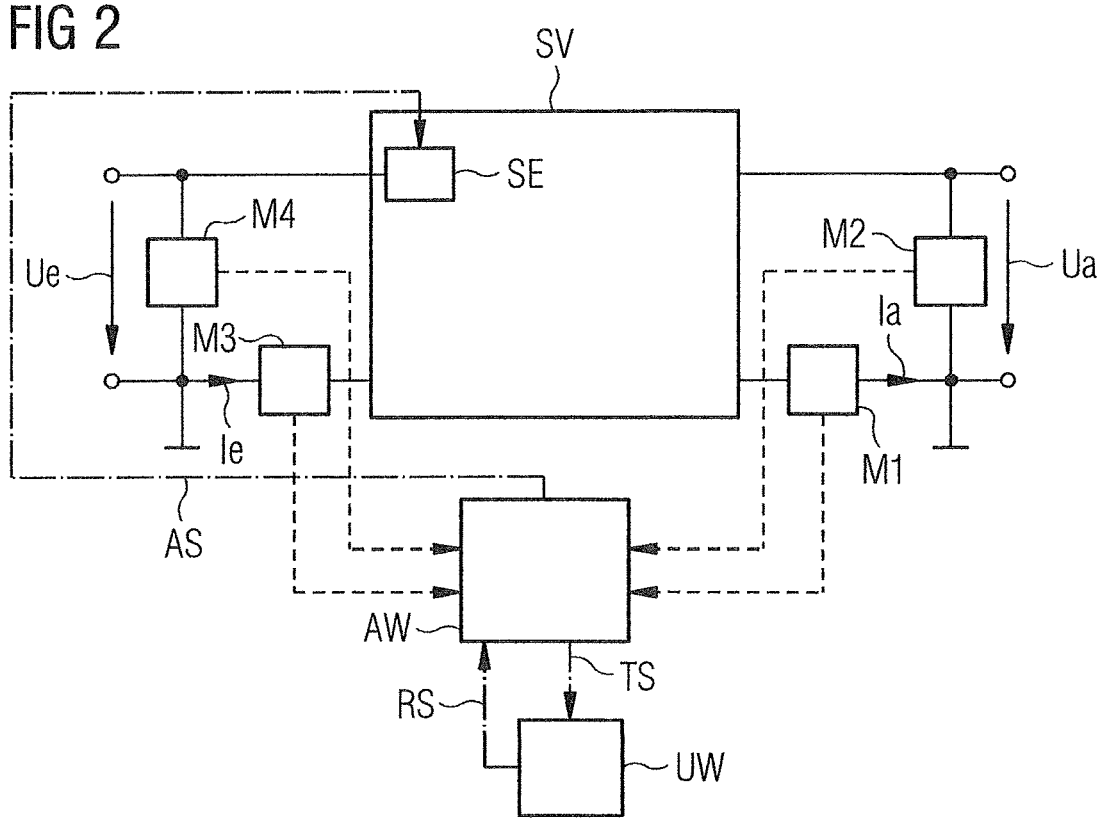
FIG. 2 schematically shows a further exemplary embodiment of the circuit in accordance with the invention, in which input parameters of the power supply unit are also measured.

FIG. 2 likewise shows a circuit in accordance with the invention, via which it is possible to perform the inventive method for complying with specified maximum values for output parameters, primarily an output current Ia and/or an output power, of a power supply unit SV. In this case, the circuit in accordance with the invention additionally has measuring units M3, M4, which are configured to continuously measure actual values of the input current Ie and the input voltage Ue. Here, actual values of the input current Ie are measured by a third measuring unit M3, which can be formed, e.g., as a shunt, a current converter, or as a device for measuring current by means of Hall sensors. An actual value of the input voltage Ue of the power supply unit SV is continuously calculated by a fourth measuring unit M4. For example, operation amplifiers, difference amplifiers or analog-digital converters can also be deployed for the purpose of measuring the input voltage Ue.

The actually measured values of input current Ie and input voltage Ue are likewise transferred to the evaluation unit AW, where they are used as a basis for calculating respective actual input power values. The evaluation unit AW then determines a difference between the actually calculated output power values and input power values, and compares this difference with a specified maximum permitted power difference. With this, it is also possible to detect faults in both the power supply unit SV and in the measuring units M1, M2 for output current Ia and output voltage Ua. If the calculated difference between actually calculated output power value and input power value exceeds the specified maximum permitted power difference, then a malfunction in the power supply unit SV and/or the measuring units M1, M2 is presumed. The current flow of the power supply unit SV is consequently interrupted by the evaluation unit AW, e.g., via a control signal AS to the switch element SE of the power supply unit SV or to an additional switch element or an additional switch converter, in order to ensure compliance with the maximum values for the output parameters of the power supply unit SV.

It is also possible with the aid of the evaluation unit AW to compare the actually measured values of the output current Ia and the output voltage Ua with corresponding control desired values for output current Ia and output voltage Ua. If it is detected in this way that the power supply unit SV or the switch converter of the power supply unit SV is operating in neither the voltage-controlled range nor the current-controlled range, then the evaluation unit AW can again send a corresponding control signal to the switch element SE of the power supply unit or to an additional switch element or a corresponding upstream or downstream switch converter to interrupt the current flow of the power supply unit SV.

In order to detect faults caused by an incorrect reference voltage, for example, it is additionally possible to measure a supply voltage of the evaluation unit AW. The evaluation unit AW compares the measured supply voltage with a specified permitted value range for the supply voltage and interrupts the current flow of the power supply unit SV if the measured supply voltage deviates from the specified permitted value range or lies outside the value range.

Furthermore, application-specific and/or customer-specific limit values for the output parameters, such as output current Ia, output voltage Ua and/or output power, can also be set and monitored by the evaluation unit AW.

As illustrated schematically by way of example in FIG. 3, the circuit in accordance with the invention can also have more than one power supply unit SV1, ..., SVn (e.g. up to eight power supply units SV1, ..., SVn), which are monitored in parallel by the evaluation unit AW for compliance with the specified maximum values for the output parameters, in particular output current Ia1, ..., Ian and output power.

At least measuring units M11, ..., M1n for measuring the respective output current Ia1, ..., Ian and measuring units M21, ..., M2n for measuring the respective output voltage Ua1, ..., Uan are mounted at each of the power supply units SV1, ..., SVn. The actual measured values of the measuring units M11, ..., M1n, M21, ..., M2n are again transferred to the evaluation unit AW and actual output power values are calculated therefrom for each power supply unit SV1, ..., SVn. The evaluation unit AW then checks compliance with the specified maximum values for output current Ia1, ..., Ian and output power for each power supply unit SV1, ..., SVn. If one or more of the power supply units SV1, ..., SVn does not comply with a maximum value or both maximum values, then the current flow of the power supply unit/units SV1, ..., SVn is interrupted by the evaluation unit AW. To this end, the evaluation unit AW can activate an additional switch element SE1, ..., SEn of the respective affected power supply unit SV1, ..., SVn correspondingly, such as via a control signal AS1, ..., ASn as explained above. Alternatively, if corresponding switch converters (e.g. SEPIC converters, flyback converters) are deployed in the power supply units SV1, ..., SVn, the internal switch element of the respective power supply units SV1, ..., SVn can also be used to interrupt the current flow.

The power supply units SV1, ..., SVn can also have measuring units M31, ..., M3n for measuring the respective input current Ie1, ..., Ien and measuring units M41, ..., M4n for measuring the respective input voltage Ue1, ..., Uen. From the actually measured values of input current Ie1, ..., Ien and input voltage Ue1, ..., Uen for the respective power supply unit SV1, ..., SVn, the evaluation unit AW can calculate actual input power values for a specific power supply unit and determine a difference between the actually calculated output power value and the input power value for each power supply unit SV1, ..., SVn. The respective difference for a specific power supply unit can then be compared with the respective maximum permitted power difference by the evaluation unit. If the maximum permitted power difference is exceeded in one or more power supply units SV1, ..., SVn, then a current flow of the power supply unit/units SV1, ..., SVn concerned can be interrupted by the evaluation unit AW.

Figure 4:
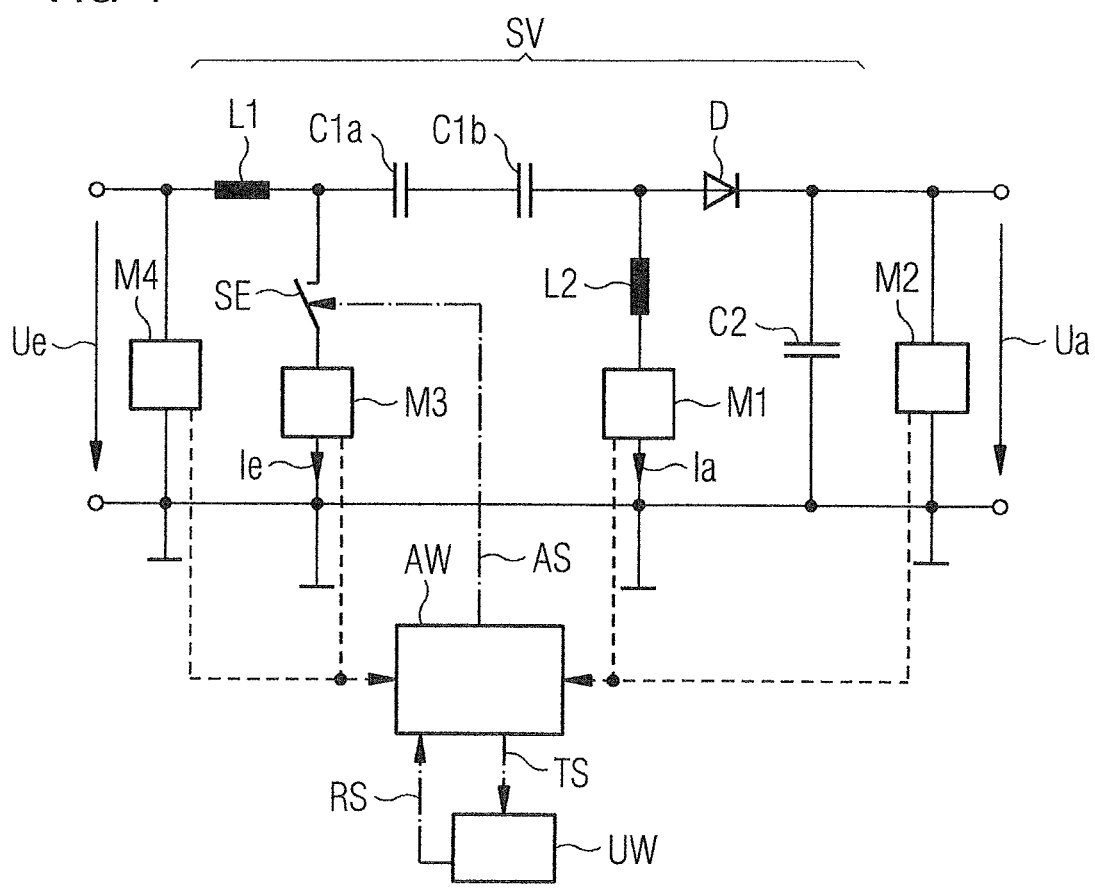
FIG. 4 schematically shows an exemplary embodiment of the circuit in accordance with the invention for performing the method for complying with specified maximum values for output parameters of a power supply unit, with a so-called SEPIC converter.

FIG. 4 schematically shows an exemplary embodiment of the circuit in accordance with the invention, where the power supply unit SV comprises a switch converter according to the SEPIC design or a so-called SEPIC converter as a non-floating switch converter. A SEPIC converter (SEPIC: single ended primary inductor converter) in the field of electronics is a form of DC/DC converter in which a positive input voltage Ue is converted into a positive output voltage Ua. As illustrated in FIG. 4, a SEPIC converter essentially comprises a switch element SE and two inductors L1, L2 and a capacitor C2 as an energy store. Provision is further made for at least one series or coupling capacitor C1a, C1b and a diode D. In the case of the embodiment of the SEPIC converter illustrated in FIG. 4, e.g., two serial series or coupling capacitors C1a, C1b are used to prevent a malfunction resulting from a short-circuit of one of the two capacitors C1a, C1b.

In order to monitor compliance with the specified maximum values for the output parameters, primarily output current Ia and output power, or to detect single faults (e.g. short-circuit, interruption) and/or malfunctions in the power supply unit SV, provision is again made for measuring units M1, M2, M3, M4 via which actual values of output current Ia, output voltage Ua, input current Ie and input voltage Ue are measured. Here, the measuring units M1, M3 for measuring output current Ia and input current Ie can be embodied as shunts, for example, where the first measuring unit M1, e.g., can be arranged in series with a second inductor L2 and the measuring unit M3 in series with the switch element SE, for example.

The evaluation unit AW is provided to evaluate the actual measured values of output current Ia, output voltage Ua, input current Ie and input voltage Ue, and calculates actual output and input power values from the actual measured values. The evaluation unit AW again compares the actually measured values of the output current Ia and the actually calculated output power values with the corresponding specified maximum values. Furthermore, a difference between the actually calculated output and input power values is calculated and compared with a specified maximum permitted power difference. If one of the specified maximum values (i.e., maximum permitted output current, maximum permitted output power and/or maximum permitted power difference) is exceeded, then the evaluation unit AW activates the switch element SE of the SEPIC converter accordingly, e.g., via a control signal AS, and the current flow of the power supply unit SV is interrupted.

Furthermore, the circuit can again have a monitoring unit UW, for example. The monitoring unit monitors the correct and fault-free functioning of the evaluation unit AW via a trigger signal TS. If the trigger signal TS is absent, then the evaluation unit AW can be reset by the monitoring unit UW by means of a reset signal RS, and the current flow is thereby interrupted in the switch converter by activating the switch element SE accordingly.

Figure 5:
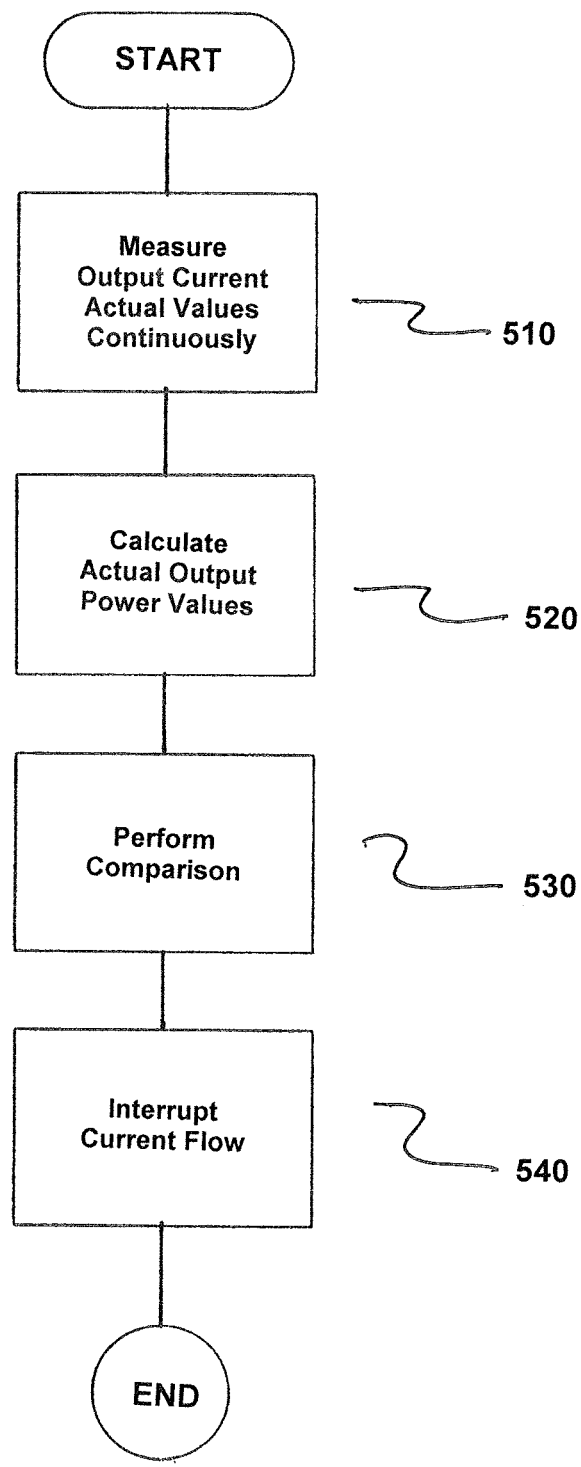
FIG. 5 is a flowchart of the method in accordance with the invention.

FIG. 5 is a flowchart of a method for complying with specified maximum values for output parameters of at least one power supply unit (SV, SV1, ..., SVn) comprising at least a non-floating switch converter, a switch element (SE), an output voltage control unit and an internal current limiter. The method comprises measuring actual values of an output current (Ia, Ia1, ..., Ian) of the at least one power supply unit (SV, SV1, ..., SVn) and actual values of an output voltage (Ua, Ua1, ..., Uan) of the at least one power supply unit (SV, SV1, ..., SVn) continuously, as indicated in step 510.

Next, actual output power values of the at least one power supply unit (SV, SV1, ..., SVn) are calculated from the actually measured values of the output current (Ia, Ia1, ..., Ian) and the output voltage (Ua, Ua1, ..., Uan) by an evaluation unit (AW), as indicated in step 520.

The respective actually measured values of the output current (Ia, Ia1, ..., Ian) and the respective actually calculated output power values are compared with corresponding specified maximum values by the evaluation unit (AW), as indicated in step 530.

The current flow of the at least one power supply unit (SV, SV1, ..., SVn) is now interrupted by the evaluation unit (AW) if at least one of the specified maximum values is exceeded by an actually measured value of at least one of the output current (Ia, Ia1, ..., Ian) and an actually calculated output power value.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for complying with specified maximum values for output parameters of at least one power supply unit comprising at least a non-floating switch converter, a switch element, an output voltage control unit and an internal current limiter, the method comprising:

measuring actual values of an output current of the at least one power supply unit and actual values of an output voltage of the at least one power supply unit continuously;

calculating, by an evaluation unit, actual output power values of the at least one power supply unit from the actually measured values of the output current and the output voltage;

comparing respective actually measured values of the output current and respective actually calculated output power values with corresponding specified maximum values by the evaluation unit; and interrupting a current flow of the at least one power supply unit by the evaluation unit if at least one of the specified maximum values is exceeded by an actually measured value of at least one of (i) the output current and (ii) an actually calculated output power value.

2. The method as claimed in claim 1, wherein actual values of an input current of the at least one power supply unit and actual values of an input voltage of the at least one power supply unit are measured continuously;

wherein respective actual input power values for the at least one power supply unit are calculated by the evaluation unit from the respective actually measured values of input current and input voltage;

wherein a difference between respective actually calculated output power values and respective actually calculated input power values is determined by the evaluation unit and compared with a specified maximum permitted power difference; and wherein the current flow of the at least one power supply unit is interrupted by the evaluation unit if the maximum permitted power difference is exceeded.

3. The method as claimed in claim 1, wherein a trigger signal is sent at regular intervals from the evaluation unit to a monitoring unit; and wherein if the trigger signal is absent, a reset signal is sent from the monitoring unit to the evaluation unit and the current flow of the at least one power supply unit is interrupted.

4. The method as claimed in claim 2, wherein a trigger signal is sent at regular intervals from the evaluation unit to a monitoring unit; and wherein if the trigger signal is absent, a reset signal is sent from the monitoring unit to the evaluation unit and the current flow of the at least one power supply unit is interrupted.

5. The method as claimed in claim 1, wherein any operation of the switch converter of the at least one power supply unit outside of a voltage-controlled range and a current-controlled range is detected by the evaluation unit based on the actually measured values of the output current and the output voltage; and wherein the current flow of the at least one power supply unit is interrupted by the evaluation unit.

6. The method as claimed in claim 2, wherein any operation of the switch converter of the at least one power supply unit outside of a voltage-controlled range and a current-controlled range is detected by the evaluation unit based on the actually measured values of the output current and the output voltage; and wherein the current flow of the at least one power supply unit is interrupted by the evaluation unit.

7. The method as claimed in claim 3, wherein any operation of the switch converter of the at least one power supply unit outside of a voltage-controlled range and a current-controlled range is detected by the evaluation unit based on the actually measured values of the output current and the output voltage; and wherein the current flow of the at least one power supply unit is interrupted by the evaluation unit.

8. The method as claimed in claim 1, further comprising:

measuring a supply voltage of the evaluation unit and comparing said measured supply voltage with a specified permitted value range for the supply voltage by the evaluation unit, and interrupting the current flow of the at least one power supply unit by the evaluation unit if the measured supply voltage deviates from the specified permitted value range.

9. The method as claimed in claim 1, wherein the switch element of the at least one power supply unit is activatable by the evaluation unit to interrupt the current flow of the at least one power supply unit.

10. The method as claimed in claim 1, wherein one of (i) an activatable switch element which is additionally mounted on an input side of the at least one power supply unit is utilized to interrupt the current flow and (ii) a switch converter which is arranged upstream or downstream of the at least one power supply unit is utilized to interrupt the current flow.

11. The method as claimed in claim 1, wherein the output parameters the at least one power supply unit comprise at least one of (i) an output current and (ii) an output power.

12. A circuit for complying with specified maximum values for output parameters of at least one power supply unit, the circuit comprising:

at least one power supply unit including at least a non-floating switch converter, a switch element, an output voltage control unit, and an internal current limiter;

measuring units for measuring actual values of an output current and an output voltage of the at least one power supply unit; and an evaluation unit which is configured to calculate actual output power values from actually measured values of the output current and the output voltage of the at least one power supply unit, configured to compare respective actually measured values of the output current and respective actually calculated output power values with specified maximum values, and configured to interrupt a current flow of the at least one power supply unit if at least one specified maximum value is exceeded.

13. The circuit as claimed in claim 12, further comprising:

additional measuring units for measuring actual values of an input current and an input voltage of the at least one power supply unit;

wherein the evaluation unit is further configured to calculate actual input power values from the actually measured values of the input voltage and the input current, further configured to determine a difference between respective actually calculated output power values and respective actually calculated input power values, further configured to compare said difference with a maximum permitted power difference, and further configured to interrupt the current flow of the at least one power supply unit if the maximum permitted power difference is exceeded.

14. The circuit as claimed in claim 12, further comprising:

a monitoring unit for receiving a trigger signal from the evaluation unit and sending a reset signal if the trigger signal is absent.

15. The circuit as claimed in claim 13, further comprising:

a monitoring unit for receiving a trigger signal from the evaluation unit and sending a reset signal if the trigger signal is absent.

16. The circuit as claimed in claim 12, wherein the switch element of the at least one power supply unit is activatable by the evaluation unit to interrupt the current flow of the at least one power supply unit.

17. The circuit as claimed in claim 12, wherein one of (i) an additional switch element is mounted on an input side of the at least one power supply unit to interrupt the current flow of the at least one power supply unit and (ii) a switch converter is arranged upstream or downstream of the at least one power supply unit to interrupt the current flow of the at least one power supply unit.

18. The circuit as claimed in claim 12, further comprising one of (i) a switch converter in accordance with SEPIC design and (ii) a non-floating flyback converter formed as a non-floating switch converter.

19. The circuit as claimed in claim 18, wherein the switch converter in accordance with the SEPIC design comprises serial series capacitors.

20. The circuit as claimed in claim 18, wherein the non-floating switch converter comprises one of (i) a buck switch and (ii) a boost switch.

\* \* \* \* \*